United States Patent [19]

Persky

[11] Patent Number: 5,031,144

[45] Date of Patent: Jul. 9, 1991

[54] FERROELECTRIC MEMORY WITH NON-DESTRUCTIVE READOUT INCLUDING GRID ELECTRODE BETWEEN TOP AND BOTTOM ELECTRODES

[75] Inventor: George Persky, Mission Viejo, Calif.

[73] Assignee: Hughes Aircraft Company, Los Angeles, Calif.

[21] Appl. No.: 486,334

[22] Filed: Feb. 28, 1990

[51] Int. Cl.$^5$ ............................................. G11C 11/22
[52] U.S. Cl. .................................... 365/145; 365/149; 357/23.6; 361/301; 361/321
[58] Field of Search ............ 365/145, 149, 117, 189.09, 365/230.06; 361/321, 301; 357/23.6

[56] References Cited

U.S. PATENT DOCUMENTS

| | | | |
|---|---|---|---|
| 3,681,765 | 8/1972 | Chapman | 365/145 |
| 4,158,201 | 6/1979 | Smith et al. | 365/145 |
| 4,358,611 | 9/1982 | Ruppel et al. | 365/145 |
| 4,707,897 | 11/1987 | Rohrer et al. | 365/145 |
| 4,853,893 | 8/1989 | Eaton, Jr. et al. | 365/145 |

OTHER PUBLICATIONS

"Ferroelectrics for Nonvolatile RAMs", IEEE Spectrum, Jul. 1989, David Bondurant and Fred Gnadinger, pp. 30–33.

Primary Examiner—Glenn Gossage
Attorney, Agent, or Firm—W. C. Schubert; W. K. Denson-Low

[57] ABSTRACT

A ferroelectric memory has a top electrode (12) a bottom electrode (14) and a grid electrode (18) having spaced conducting members located between the top electrode (12) and the bottom electrode (14). A ferroelectric material (16) is positioned between the top electrode and the bottom electrode. A dielectric material (20) is located immediately between the spaced coducting members of the grid electrode (18) and the top electrode (20). This forms ferroelectric fingers (22) which can be selectively polarized by applying a voltage between the top electrode and the grid electrode during reading of the memory cell (10). When the read operation is complete, the ferroelectric fingers (22) will spontaneously repolarize to the state of the rest of the continuous ferroelectric bulk (16). This results in a ferroelectric memory with nondestructive readout.

12 Claims, 2 Drawing Sheets

FERROELECTRIC MEMORY WITH NON-DESTRUCTIVE READOUT INCLUDING GRID ELECTRODE BETWEEN TOP AND BOTTOM ELECTRODES

BACKGROUND OF THE INVENTION

1. Field of the Invention

This invention relates to computer memories and, more particularly, to ferroelectric memories.

2. Discussion

Semiconductor memories are used in computer systems to perform a variety of functions—bulk data storage, program storage, temporary storage, and cache (or intermediate) storage. Semiconductor memories fall into two general categories: nonvolatile and volatile memories. Nonvolatile memories are randomly accessible memories which do not lose information loaded into their storage cells even if electrical power is shut off. Nonvolatile memories include mask programmable read only memories (ROMs), fuse programmable read only memories (PROMs), ultraviolet erasable programmable read only memories (UVEPROMs), electrically alterable read only memories (EAROMs), electrically erasable programmable read only memories (EEPROMs), and nonvolatile static RAMs (NV RAMs).

Volatile memories, on the other hand, typically will lose information stored in their storage cells when power to the memory circuit is shut off. The most common type of volatile memory is the read/write random access memory (RAM). This memory has the distinct advantage that data can be written into the memory as well as read out of it. There are two different types of read/write RAMs—dynamic and static. Dynamic RAMs use a storage cell based on a transistor and capacitor combination and will lose their charge unless the charge is repeatedly replenished (refreshed) on a regular basis (every few milliseconds). If refreshed, the information will remain until intentionally changed or the power to the memory is shut off. Static memories, in contrast, do not use a charge—storage technique; instead, they use either four or six transistors to form a flip-flop for each cell in the array. Once data is loaded into the flip-flop storage elements, the flip-flop will indefinitely remain in that state until that information is intentionally changed or the power to the memory circuit is shut off. To avoid the loss of memory in volatile memories, such as dynamic and static RAMs during a power loss, most computer systems utilize some sort of battery back-up to insure continued power to the volatile memories. An additional problem with dynamic and static RAMs is the destruction of the data in the memory when their memory is being read. Thus, it would be desirable to provide a read/write RAM memory which is non-volatile. It would further be desirable to provide such a memory with a nondestructive readout.

Ferroelectric capacitors have recently been employed in an effort to develop a nonvolatile RAM. Ferroelectrics are crystalline substances which have a permanent spontaneous electric polarization that can be reversed by an electric field. Consequently, thin-film ferroelectric capacitors, which can be permanently polarized to store digital data, are being substituted for the silicon dioxide capacitors typically used in the standard RAM memory cell to store charge and hence data. See F. P. Gnadinger and D. W. Bondurant, "Ferroelectrics for Nonvolatile RAM's", IEEE Spectrum, July, 1989, page 30, for a review of current research in this area. Besides being nonvolatile, ferroelectric RAMs may yield additional advantages. These include a higher charge density which means a smaller capacitor permitting smaller overall memory size. Also, higher switching speeds, longer endurance (the number of read/write cycles a memory can undergo before losing the ability to store data), and better data retention due to reduced charge leakage are possible.

An additional advantage is that ferroelectric memories are inherently radiation hard. On the other hand, in ferroelectric memories, the readout process typically destroys the data, thus requiring an immediate rewrite to restore it. While performing the rewrite is not difficult, it would be desirable to have a ferroelectric memory with nondestructive readout so that the rewrite may be avoided. Further, if the rewrite cycle is disrupted, for example, if the circuitry is exposed to transient radiation during the rewrite, the rewrite may fail with consequent loss of data. Therefore, for operation in such environments, it would especially be desirable to have a memory with non-destructive readout, so that rewriting is unnecessary.

SUMMARY OF THE INVENTION

The present invention is directed to a ferroelectric memory with nondestructive readout. The ferroelectric memory includes a top electrode plate, used as a common electrode, a bottom electrode plate used for writing, and a ferroelectric material adjacent to and between the top and bottom electrode plates. In addition, a third grid electrode for reading is positioned within the ferroelectric material having intermittent spaced conducting members. A non-ferroelectric dielectric may be positioned in the region between the grid electrode spaced conducting members and the top electrode. As a result, ferroelectric "fingers" are formed in the ferroelectric material between the spaced conducting members. The polarization of the ferroelectric fingers will be altered during a readout, but not the polarization of the main bulk of the ferroelectric between the grid electrodes and the bottom electrode plate. Consequently, when a readout voltage is applied between the top electrode and the grid electrode during a read operation, the polarization of the ferroelectric fingers will be altered, but not that of the main bulk of the ferroelectric. When the readout is complete, the bulk ferroelectric may then coerce the fingers to spontaneously resume the initial state of polarization. In this way, a fully nondestructive readout is realized.

BRIEF DESCRIPTION OF THE DRAWINGS

The various advantages of tee present invention will become apparent to one skilled in the art by reading the following specifications and by reference to the drawings in which.

DESCRIPTION OF THE PREFERRED EMBODIMENTS

Figure 1:
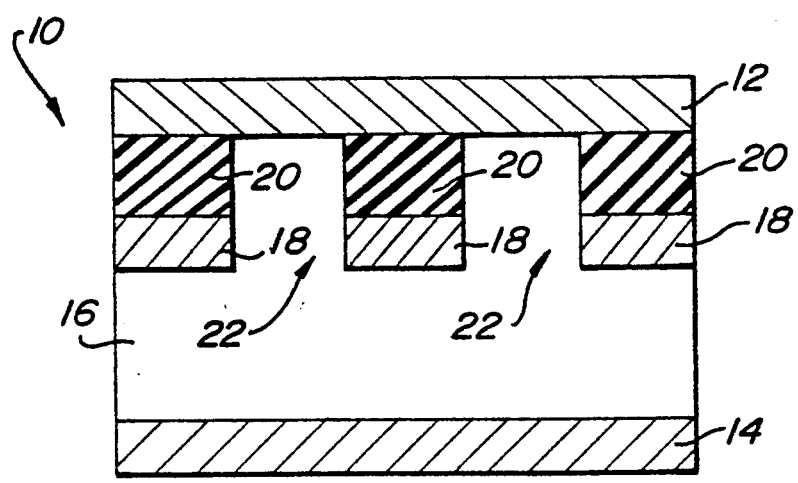
FIG. 1 is a cross-sectional view of a ferroelectric memory cell with nondestructive readout in accordance with a first embodiment of the present invention.

Turning now to FIG. 1, a ferroelectric memory cell 10 is provided for storing digital information in a semiconductor memory. The ferroelectric memory cell 10 includes a top electrode plate 12 and a bottom electrode plate 14 separated by ferroelectric material 16. It will be appreciated by those skilled in the art that the ferroelectric memory cell 10 will be part of an array of similar cells constructed using conventional semiconductor technology such as CMOS or other technologies. The ferroelectric memory cell 10 may be used as a memory capacitor in a standard memory architecture such as a DRAM.

The dimensions of the top electrode 12, bottom electrode 14, and ferroelectric material 16, will depend on the density of the memory device. For example, the ferroelectric material may be a thin-film having a depth in the range of micrometers. The electrodes may be constructed of conventional electrode metals such as gold, aluminum or polysilicon. The ferroelectric material 16 may be constructed of conventional ferroelectric materials such as lead zirconate titanate (PZT), lithium niobate, or barium titanate.

Figure 2:
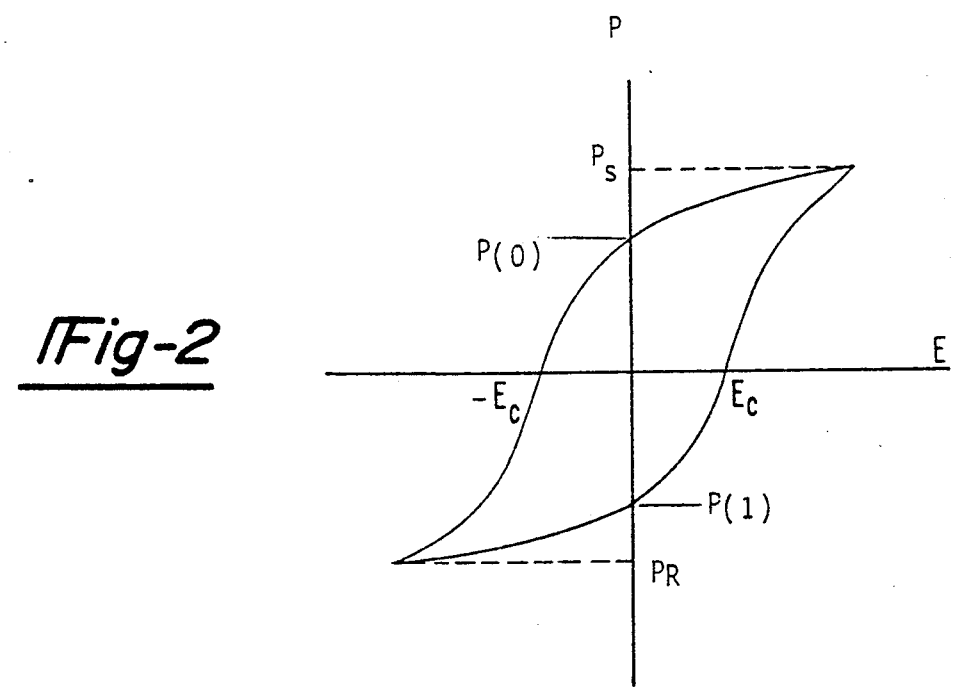
FIG. 2 is a graph of the hysteresis curve of a typical ferroelectric capacitor.

It will be appreciated that in a conventional ferroelectric memory, the memory cell is constructed of simply a top electrode plate 12 and a bottom electrode plate 14 surrounding a ferroelectric material 16. Data is written into the cell by a applying voltage sufficient to cause saturated polarization in one direction or the other. It is a characteristic of ferroelectric materials that once sufficient voltage is applied and removed, the polarization will fall back to a somewhat smaller remanent or residual polarization which can be retained indefinitely. This is illustrated in FIG. 2, which shows a characteristic hysteresis curve of a ferroelectric thin-film memory capacitor. In FIG. 2 the polarization P is plotted as a function of the electric field. Starting from the lower left hand vertex, the polarization curve first follows the lower curve rising from $P_r$, the reset polarization, through P(1), the residual reset polarization, to $P_s$, the set polarization. When E is removed, the polarization drops to P(0), the residual set polarization. Likewise, when E is then reversed, the polarization follows the upper curve, crossing through zero at $-E_c$, where $E_c$ is the coercive electric field. Finally, as the electric field is brought to its negative maximum value, the polarization returns to $P_r$.

To read data from the memory cell, the direction of this polarization P must be sensed. During the readout cycle, a voltage is applied to the cell. There are two possible consequences. If the field, due to the applied voltage is parallel to the polarization, only a small current will be sensed as the polarization is increased from its residual value to the set or reset value. If the field is anti-parallel, however, there will be a large current pulse as the polarization is flipped to saturation in the other direction. In this case, it is clear that the readout operation also destroys the data content of the memory cell. Hence, in conventional ferroelectric memories, the readout must be followed by a rewrite to restore the memory data.

To achieve a non-destructive readout and avoid the necessity of a rewrite, the ferroelectric memory cell 10, in accordance with the present invention, employs a grid electrode 18 and a non-ferroelectric dielectric 20. As shown in FIG. 1, the grid electrode 18 is constructed of a conductive material that is similar to the other electrodes 12 and 14. The grid electrode 18 is located substantially nearer the top electrode plate 12 than the bottom electrode plate 14. The non-ferroelectric dielectric 20 fills the region immediately above the grid electrode 18 up to the top electrode 12. This structure results in the creation of ferroelectric fingers 22 extending up between the grid electrode 18.

To write into the memory cell 10, voltage is applied between the top electrode 12 and the bottom electrode 14. During the write operation, the grid electrode 18 should be allowed to float. Alternatively, it may be maintained at a potential about half way between the potentials of the top electrode 12 and the bottom electrode 14. This will result in an essentially uniform polarization of all of the ferroelectric material 16.

To read from the ferroelectric memory cell 10, a readout voltage is applied between the top electrode 12 and the grid electrode 18. It will be appreciated that this will require separate read and write lines. In contrast, conventional ferroelectric memories would use the same pair of electrodes, that is, the top electrode 12 and bottom electrode 14 for both reading and writing. Those skilled in the art will appreciate that the conventional read/write circuitry may easily be adapted to utilize separate read and write lines.

Also, it has been found that the read/write circuitry should be relatively sensitive in readout, particularly if a much reduced readout voltage is used. On the other hand, the read/write circuitry can be simplified because it need not perform a write after each read. Nor does this circuitry need to attempt to block the read/write cycle because of a disruptive event.

Figure 3:
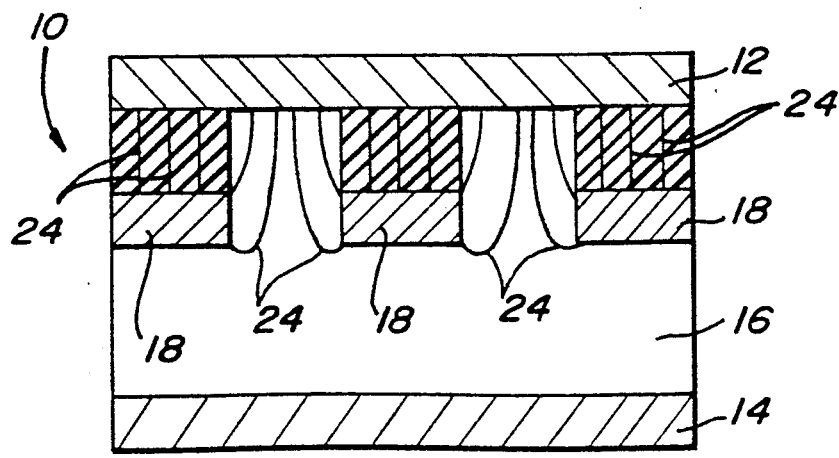
FIG. 3 is a cross sectional diagram of the ferroelectric memory cell with nondestructive readout showing the electric field profile during a readout operation.

In accordance with the present invention, the electric field profile during the readout operation is shown in FIG. 3. Electric field lines 24 are formed between the grid electrode 18 and the top electrode 12 upon application of the readout voltage. The magnitude of this voltage will be a fraction of the write line voltage and will depend on numerous factors, but may be, for example, in the range of 1 to 5 volts. Thus, the polarization of the ferroelectric fingers 22 will be altered during the readout, but not that of the main bulk of the ferroelectric 16, below. When the readout is complete, the bulk of the ferroelectric material 16 will coerce the fingers 22 to spontaneously resume the initial state of polarization. It will be appreciated that spontaneous repolarization depends on a number of factors, such as the applied voltages and the particular ferroelectric material properties. If these factors are not carefully controlled, the ferroelectric fingers 22 can fail to spontaneously repolarize, or the repolarization could proceed in the other direction and alter the state of the ferroelectric bulk.

One approach is through judicious application of the readout voltage. This voltage would, in any event, be smaller than the write voltage in order to produce electric field strengths of the same magnitude. However, if it is further reduced, so that the polarization of the fingers are driven only enough to detect asymmetry during the read operation, rather than fully reversed, repolarization should proceed in the proper direction.

In addition, the ferroelectric material should be selected to have a coercive field $E_c$ and remanent polarization that will optimize the tradeoff between repolarization of the fingers 22 and permanency of the state of the ferroelectric bulk 16.

Figure 4:
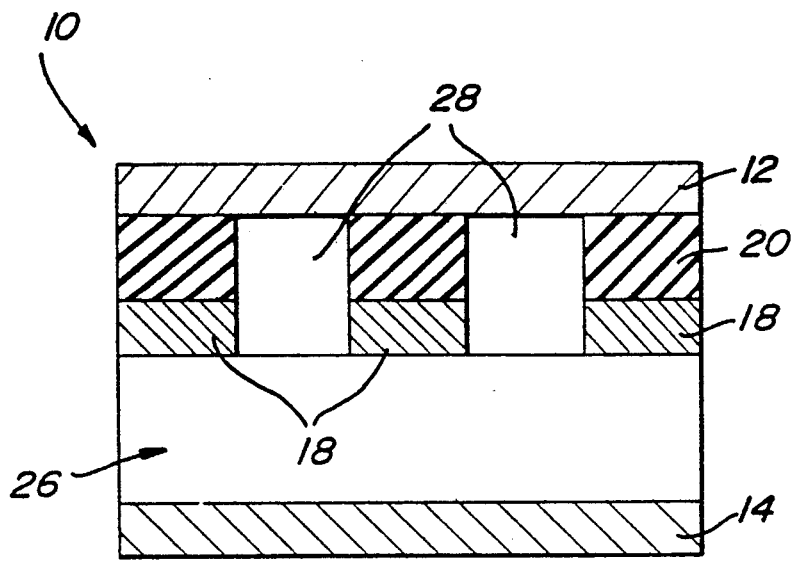
FIG. 4 is a cross section of the ferroelectric memory cell with nondestructive readout having a double layer of ferroelectric material in accordance with a second embodiment of the present invention.
Figure 5:
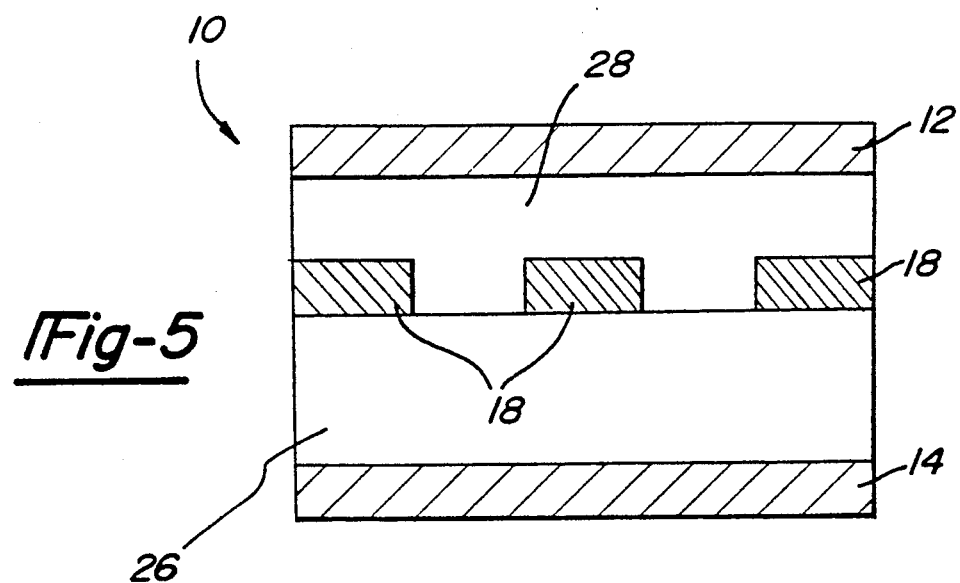
FIG. 5 is a cross sectional view of the ferroelectric memory cell having a simplified double layer structure in accordance with the third embodiment of the present invention.

In a second embodiment of the present invention, a ferroelectric memory cell is achieved by the use of two different films of ferroelectric material, as shown in FIG. 4. The top electrode 12, bottom electrode 14, grid electrode 18, and dielectric 20 are similar to those shown in FIG. 1. However, the ferroelectric is in two portions, a high $E_c$ (coercive field) ferroelectric material 26 is positioned adjacent to the bottom electrode 14 and a low $E_c$ ferroelectric material 28 comprises the ferroelectric fingers. This embodiment will help to insure the correct repolarization and will also permit a larger readout voltage to be used without causing the ferroelectric fingers 22 to fail to spontaneously repolarize correctly. As an example, the coercive field of ferroelectric material 26 may be in range from approximately 50 kv/cm to approximately 150 kv/cm while the coercive field of ferroelectric material 28 may be in the range from approximately 25 kv/cm to approximately 50 kv/cm. FIG. 5 shows a simplified ferroelectric memory cell in accordance with a third embodiment of the present invention. This embodiment is essentially identical to that shown in FIG. 4 with the exception that the dielectric has been removed entirely. This has the result of greatly simplifying the overall structure, and also will result in a ferroelectric memory cell with greater volume of readout material and stronger readout signals.

From the foregoing description, it can be appreciated that the ferroelectric memory cell 10 is a nonvolatile memory that permits nondestructive readout to be achieved. Consequently, the necessity to rewrite after read is eliminated and the risk of losing data if the rewrite cycle is disrupted is removed. The basic ferroelectric memory cell 10 in accordance with the present invention can be employed in a number of memory types and technologies. Those skilled in the art can appreciate that other advantages can be obtained from the use of this invention and that modifications can be made without departing from the true spirit of the invention after studying the specification, drawings, and following claims.

What is claimed is:

1. A ferroelectric memory cell comprising:
 a top electrode plate;
 a bottom electrode plate;
 ferroelectric material disposed between said top and bottom electrode plates;
 a grid electrode having spaced conducting members positioned within said ferroelectric material; and
 nonferroelectric dielectric members disposed between the spaced, conducting members and the top electrode, wherein ferroelectric fingers are formed in said ferroelectric material between said members, whereby the ferroelectric fingers can be selectively polarized in order to read from the memory cell when a voltage is applied between said top electrode plate and said grid electrode.

2. The ferroelectric memory cell of claim 1 wherein said grid electrode is closer to said top electrode plate than to said bottom electrode plate.

3. The ferroelectric memory cell of claim 1 wherein said ferroelectric material includes first and second regions and an interface therebetween, said first and second regions having differing coercive fields, a portion of said interface between the first and second regions being adjacent to said grid electrode.

4. The ferroelectric memory cell of claim 3 wherein said first region of ferroelectric material is adjacent to said top electrode plate and said second region of ferroelectric material is adjacent to said bottom electrode plate, and wherein said first region has a relatively low coercive field and said second region has a relatively high coercive field.

5. The ferroelectric memory cell of claim 4 wherein said first region of ferroelectric material has a coercive field in the range from approximately 25 kv/cm to approximately 50 kv/cm.

6. The ferroelectric memory cell of claim 4 wherein said second region of ferroelectric material has a coercive field in the range from approximately 50 kv/cm to approximately 150 kv/cm.

7. A ferroelectric memory cell comprising:
 a top electrode plate;
 a bottom electrode plate;
 a grid electrode having spaced, conducting members positioned between said top and bottom electrode plates; and
 ferroelectrode material disposed between said top and bottom electrode plates, said ferroelectric material including first and second regions separated at an interface and having different coercive fields, the interface between the first and second regions being at least in part adjacent to said grid electrode, whereby the first region can be selectively polarized for reading out the memory cell when a voltage is applied between said top electrode plate and said grid electrode.

8. The ferroelectric memory cell of claim 7 wherein said first region of ferroelectric material has a coercive field in the range from approximately 25 kv/cm to approximately 50 kv/cm.

9. The ferroelectric memory cell of claim 7 wherein said second region of ferroelectric material has a coercive field in the range from approximately 50 kv/cm to approximately 150 kv/cm.

10. The ferroelectric memory cell of claim 7 wherein said grid electrode is closer to said top electrode plate than to said bottom electrode plate.

11. The ferroelectric memory cell of claim 10 wherein said first region of ferroelectric material is adjacent to said top electrode plate and said second region of ferroelectric material is adjacent to said bottom electrode plate, and said first region has a relatively low coercive field, and said second region has a relatively high coercive field.

12. A ferroelectric memory cell comprising:
 a top electrode plate;
 a bottom electrode plate;
 a grid electrode having spaced, conducting members located between said top and bottom electrode plates, said grid electrode being located closer to said top electrode plate than to said bottom electrode plate;
 ferroelectric material disposed between said top and bottom electrode plates including first and second regions having different coercive fields, said first and second regions forming an interface therebetween, said interface being at least partially adjacent to said grid electrode, said first region of ferroelectric material being adjacent to said top electrode plate and having a coercive field in the range from approximately 25 kv/cm to approximately 50 kv/cm, and said second region of ferroelectric material being adjacent to said bottom electrode plate and having a coercive field in the range from approximately 50 kv/cm to approximately 150 kv/cm; and nonferroelectric dielectric members disposed between said conducting members and said top electrode plate, wherein ferroelectric fingers are formed in said ferroelectric material between said conducting members, whereby the ferroelectric fingers can be selectively polarized to read out said memory cell when a voltage is applied between said top electrode plate and said grid electrode.

* * * * *